(12) United States Patent  
Kuraoka et al.

(10) Patent No.: US 7,982,241 B2  
(45) Date of Patent: Jul. 19, 2011

(54) EPITAXIAL SUBSTRATE, SEMICONDUCTOR DEVICE SUBSTRATE, AND HEMT DEVICE

(75) Inventors: Yoshitaka Kuraoka, Anjo (JP); Makoto Miyoshi, Inazawa (JP); Shigeaki Sumiya, Handa (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 164 days.

(21) Appl. No.: 12/535,859

(22) Filed: Aug. 5, 2009

(65) Prior Publication Data

US 2010/0051961 A1    Mar. 4, 2010

(30) Foreign Application Priority Data

Sep. 4, 2008 (JP) ................................ 2008-226862  
Jun. 8, 2009 (JP) ................................ 2009-136860

(51) Int. Cl.  
*H01L 29/24* (2006.01)  
*H01L 29/778* (2006.01)

(52) U.S. Cl. ..... 257/194; 257/76; 257/77; 257/E29.104; 257/E29.246

(58) Field of Classification Search .................. 257/76, 257/77, 194, E29.104, E29.246  
See application file for complete search history.

(56) References Cited

U.S. PATENT DOCUMENTS

| | | | |
|---|---|---|---|
| 6,583,454 B2 | 6/2003 | Sheppard et al. | |
| 6,869,702 B2 | 3/2005 | Shibata et al. | |
| 7,687,824 B2 * | 3/2010 | Shibata et al. | 257/103 |
| 7,786,503 B2 * | 8/2010 | D'Evelyn et al. | 257/103 |
| 7,859,008 B2 * | 12/2010 | D'Evelyn et al. | 257/103 |
| 2005/0287774 A1 * | 12/2005 | Shibata et al. | 438/502 |
| 2006/0169996 A1 * | 8/2006 | D'Evelyn et al. | 257/94 |
| 2006/0220039 A1 | 10/2006 | Yokoyama et al. | |
| 2007/0040181 A1 * | 2/2007 | D'Evelyn et al. | 257/94 |
| 2007/0158785 A1 * | 7/2007 | D'Evelyn et al. | 257/615 |
| 2008/0006844 A1 * | 1/2008 | D'Evelyn et al. | 257/103 |
| 2009/0176352 A1 | 7/2009 | Yokoyama et al. | |
| 2009/0194784 A1 * | 8/2009 | Kaji et al. | 257/103 |
| 2009/0289270 A1 * | 11/2009 | Hanawa et al. | 257/98 |
| 2011/0042682 A1 * | 2/2011 | Preble et al. | 257/76 |

FOREIGN PATENT DOCUMENTS

| | | |
|---|---|---|
| JP | 2002-520880 A1 | 7/2002 |
| JP | 2004-200384 A1 | 7/2004 |
| JP | 2006-286741 A1 | 10/2006 |

* cited by examiner

*Primary Examiner* — Victor Mandala (74) *Attorney, Agent, or Firm* — Burr & Brown (57) ABSTRACT

A buffer layer formed of $In_{x1}Al_{y1}Ga_{z1}N$ formed on a base, with an upper part of the buffer layer containing columnar polycrystalline including a grain boundary existing in a direction substantially perpendicular to a surface of the base. The number of grain boundaries in the lower part of the buffer layer is greater than that in the upper part, and a full width at half maximum of an X-ray rocking curve of the upper part is 300-3000 seconds, RMS of the surface of the buffer layer is 0.2 nm-6 nm, and the ratio of the grain boundary width of the crystal grain of the upper part in a direction parallel to the base surface to the formation thickness of the buffer layer is 0.5-1.5.

17 Claims, 10 Drawing Sheets

| | STRUCTURE EVALUATION OF BUFFER LAYER | | | | | | | | | STRUCTURE EVALUATION OF FUNCTIONAL LAYER | | |
|---|---|---|---|---|---|---|---|---|---|---|---|---|
| | MEASUREMENT 1 | MEASUREMENT 2 | | | | | MEASUREMENT 4 | MEASUREMENT 5 | | MEASUREMENT 6 | | MEASUREMENT 7 |
| | CRYSTAL QUALITY | TEM OF CROSS SECTION | | | | | SURFACE ROUGHNESS | LATTICE DISTORTION | | CRYSTAL QUALITY | | APPEARANCE |
| | XRC (0002) ω SCAN | UPPER PART | | | LOWER PART | | AFM MEASUREMENT (5 μm □) | XRC (11-24) | | XRC (0002) ω SCAN | | DIFFERENTIAL INTERFERENCE CONTRAST MICROSCOPE |
| SAMPLE No. | FULL WIDTH AT HALF MAXIMUM [arcsec.] | WIDTH w [nm] | THICKNESS t [nm] | ASPECT RATIO w/t | WIDTH w' [nm] | THICKNESS t' [nm] | ROOT MEAN SQUARE ROUGHNESS RMS [nm] | DIFFERENCE OF LATTICE CONSTANTS OF a AXIS [%] TENSION:POSITIVE COMPRESSION:NEGATIVE | | FULL WIDTH AT HALF MAXIMUM [arcsec.] | | PRESENCE OR ABSENCE OF CRACKS |
| 1 | 650 | 273 | 200 | 1.37 | 37 | 48 | 0.28 | -0.75 | | 205 | | ABSENT |
| 2 | 1800 | 172 | 200 | 0.86 | 32 | 43 | 0.56 | -0.53 | | 265 | | ABSENT |
| 3 | 1300 | 198 | 200 | 0.99 | 35 | 40 | 0.22 | -0.64 | | 230 | | ABSENT |
| 4 | 3210 | 93 | 200 | 0.47 | 93 | — | 6.20 | +0.03 | | 360 | | ABSENT |
| 5 | 2220 | 110 | 200 | 0.55 | 29 | 36 | 1.20 | -0.45 | | 250 | | ABSENT |
| 6 | 280 | 360 | 200 | 1.80 | 25 | 67 | 0.18 | -0.78 | | 160 | | PRESENT |
| 7 | 230 | 345 | 200 | 1.73 | 23 | 65 | 0.16 | -0.79 | | 145 | | PRESENT |
| 8 | 250 | 420 | 200 | 2.10 | 18 | 64 | 0.18 | -0.77 | | 155 | | PRESENT |
| 9 | 3120 | 91 | 100 | 0.91 | 91 | — | 7.02 | +0.13 | | 320 | | ABSENT |
| 10 | 2950 | 113 | 100 | 1.13 | 28 | 44 | 0.36 | -0.05 | | 250 | | ABSENT |
| 11 | 2700 | 146 | 100 | 1.46 | 30 | 58 | 1.07 | -0.31 | | 290 | | ABSENT |
| 12 | 2680 | 335 | 100 | 3.35 | 21 | 90 | 0.16 | -0.38 | | 250 | | ABSENT |
| 13 | 2600 | 275 | 100 | 2.75 | 26 | 75 | 0.18 | -0.45 | | 210 | | ABSENT |
| 14 | 270 | 473 | 300 | 1.58 | 37 | 63 | 0.19 | -0.78 | | 150 | | PRESENT |
| 15 | 200 | 323 | 300 | 1.08 | 25 | 42 | 0.15 | -0.82 | | 140 | | PRESENT |
| 16 | 430 | 202 | 300 | 0.67 | 38 | 39 | 5.85 | -0.77 | | 190 | | ABSENT |
| 17 | 670 | 136 | 300 | 0.45 | 32 | 32 | 7.58 | -0.81 | | 220 | | ABSENT |
| 18 | 320 | 286 | 300 | 0.95 | 23 | 50 | 0.95 | -0.79 | | 170 | | ABSENT |

EPITAXIAL SUBSTRATE, SEMICONDUCTOR DEVICE SUBSTRATE, AND HEMT DEVICE

BACKGROUND OF THE INVENTION

1. Field of the Invention

The present invention relates to an epitaxial substrate prepared by epitaxially growing a group III nitride semiconductor on an SiC base, and to an HEMT device using the same.

2. Description of the Background Art

Nitride semiconductors having higher breakdown electric field and higher electron saturation velocities have been drawing attention as semiconductor materials for high-frequency and high-power devices. In manufacturing such devices, a group III nitride semiconductor is generally epitaxially grown on a predetermined base substrate. While an SiC substrate, a sapphire substrate or the like is mainly used as a base substrate, defect density of the group III nitride semiconductor grown thereon can be much more reduced (crystal quality is further improved) when using the SiC substrate than when using the sapphire substrate since SiC has a lattice constant closer to AlN and GaN than sapphire. Further, an SiC substrate has excellent heat conductivity. Thus, high output power and high-frequency characteristics of devices are expected to be improved by using the SiC substrate.

On the other hand, a technique to use an AlN film as a buffer layer in forming a GaN film on the SiC substrate has been already well known (for example, see National Publication of Translation No. 2002-520880, Japanese Patent Application Laid-Open No. 2006-286741, and Japanese Patent Application Laid-Open No. 2004-200384).

As disclosed in National Publication of Translation No. 2002-520880, Japanese Patent Application Laid-Open No. 2006-286741, and Japanese Patent Application Laid-Open No. 2004-200384, a technique of forming an AlN film on the SiC substrate as a buffer layer, and forming a GaN film thereon is well known. However, National Publication of Translation No. 2002-520880 and Japanese Patent Application Laid-Open No. 2006-286741 do not disclose any of the relationship of a specific formation of an AlN film functioning as a buffer layer to crystal quality of a GaN film, and further to a characteristics of an electronic device configured to form a functional layer with the GaN film or the like.

The inventors of the present invention have made it clear that cracks are easy to be generated in a channel layer when a buffer layer is formed of AlN having excellent crystal quality, as disclosed in Japanese Patent Application Laid-Open No. 2004-200384, and the channel layer formed of GaN is grown.

SUMMARY OF THE INVENTION

The present invention is directed to an epitaxial substrate prepared by epitaxially growing a group III nitride semiconductor on an SiC base, and to an HEMT device using the same.

The epitaxial substrate according to the present invention includes: a base constituted of α-SiC single crystal, a buffer layer formed by epitaxially growing on the base and formed of a group III nitride expressed in a composition formula $In_{x1}Al_{y1}Ga_{z1}N$ ($0 \leq x1 \leq 1$, $0 < y1 \leq 1$, $0 \leq z1 \leq 1$, $x1+y1+z1=1$), wherein an upper part of the buffer layer including a surface part of the epitaxial substrate is formed of columnar polycrystalline including a grain boundary existing on the base in a direction substantially perpendicular to a substrate surface and being oriented at a c axis, a lower part of the buffer layer which is near an interface with the base has more grain boundaries than the upper part of the buffer layer, transition of shape of crystalline grain between the lower part and the upper part of the buffer layer is local and gradational, and a full width at half maximum of an X-ray rocking curve (0002) ω scan of the upper part of the buffer layer is not less than 300 seconds and not more than 3000 seconds.

Thereby, the epitaxial substrate capable of laminating functional layers formed of a group III nitride having preferable crystal quality without causing cracks can be obtained.

Preferably, root mean square roughness of a surface of the buffer layer is not less than 0.2 nm and not more than 6 nm.

Thereby, when functional layers are formed on the epitaxial substrate, FET having excellent characteristics with mobility of at least 1300 cm$^2$/Vs and drain current of at least 1000 mA/mm can be manufactured.

More preferably, the root mean square roughness of the surface of the buffer layer is not less than 0.2 nm and not more than 1 nm.

Thereby, when functional layers are formed on the epitaxial substrate, FET having more excellent characteristics with mobility of at least 1500 cm$^2$/Vs, drain current of at least 1200 mA/mm, and gate leakage current of not more than 0.1 μA/mm can be manufactured.

It is therefore an object of the present invention to provide an epitaxial substrate capable of fabricating an electronic device having excellent characteristics, and an electronic device manufactured by using the same.

These and other objects, features, aspects and advantages of the present invention will become more apparent from the following detailed description of the present invention when taken in conjunction with the accompanying drawings.

DETAILED DESCRIPTION OF THE INVENTION

Overview of Epitaxial Substrate and HEMT Device

Figure 1:
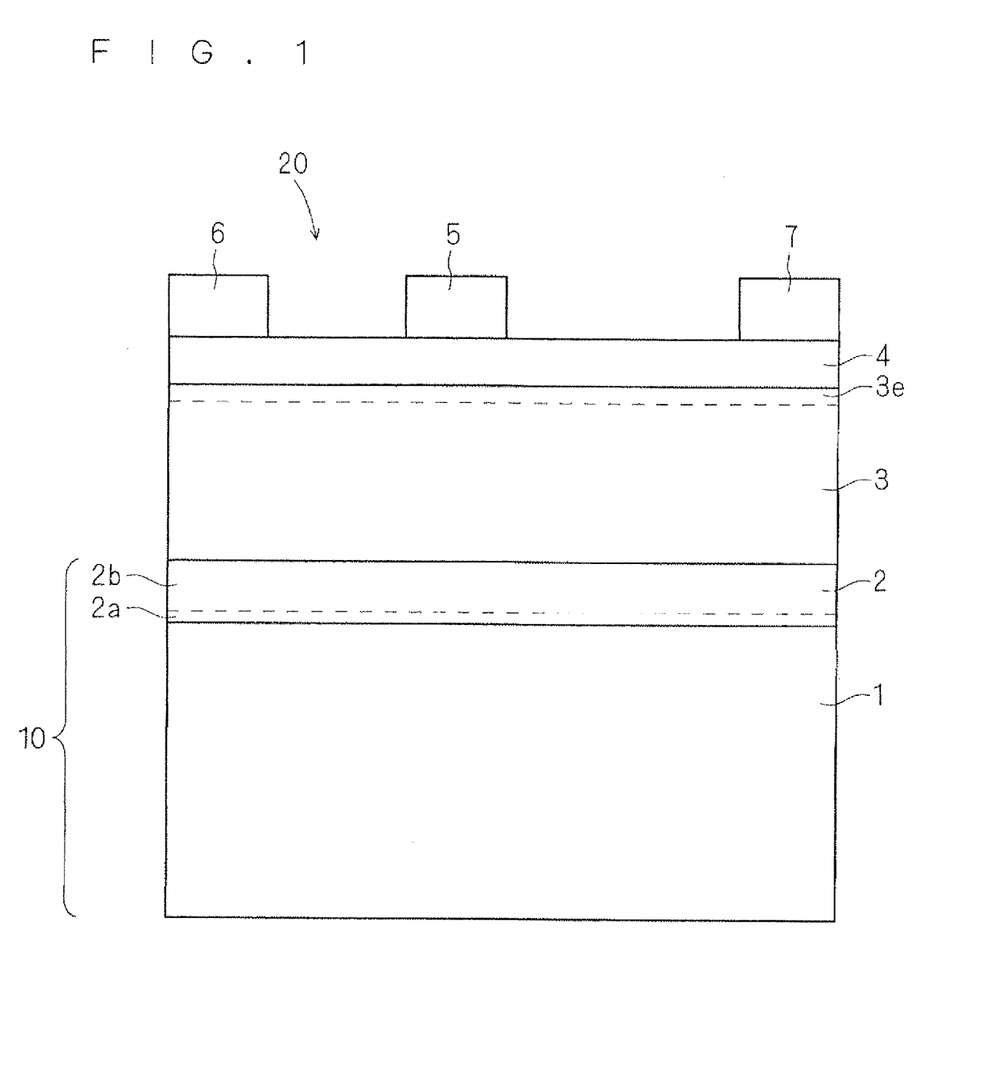
FIG. 1 is a view for schematically showing a cross sectional structure of an HEMT device as one of the aspects of FET configured to include an epitaxial substrate according to the preferred embodiment of the present invention.

FIG. 1 is a view for schematically showing a cross sectional structure of a high electron mobility transistor (HEMT) device 20 as one of the aspects of FET configured to include an epitaxial substrate 10 according to the preferred embodiment of the present invention. The epitaxial substrate 10 is configured to epitaxially form a buffer layer 2 on a base 1. The HEMT device 20 is configured to laminate a channel layer 3 and a barrier layer 4, which are group III nitride semiconductor layers, on the epitaxial substrate 10 (on the buffer layer 2). Hereinafter, the channel layer 3 and the barrier layer 4 are sometimes collectively referred to as a functional layer. Further, the HEMT device 20 is configured to be provided with a gate electrode 5, a source electrode 6, and a drain electrode 7 on the barrier layer 4. It should be noted that the ratio of a thickness of each layer in FIG. 1 reflects no real thickness thereof.

One of the preferable examples of the base 1 is to use a single crystal substrate of hexagonal SiC (such as 2H—SiC substrate, 4H—SiC substrate, or 6H—SiC substrate). There are no special material limitations on the thickness of the base 1, but the base 1 having a thickness ranging from hundreds of micrometers to several millimeters is preferable for convenience of handling. Or, rhombohedral SiC which is also α-type SiC similarly to the hexagonal SiC may be used.

The buffer layer 2 has a thickness of approximately several hundred nm (e.g. 100 nm to 300 nm) with a first group III nitride expressed in a composition formula $In_{x1}Al_{y1}Ga_{z1}N$ ($0 \leq x1 \leq 1$, $0 < y1 \leq 1$, $0 \leq z1 \leq 1$, $x1+y1+z1=1$). One of the preferable examples of the buffer layer 2 is to be formed of AlN.

The buffer layer 2 is a polycrystalline layer, if seen schematically, having a surface (a surface with the channel layer 3 being formed thereon) consisted of numerous columnar crystalline grains, each of which being oriented at a c axis. In the preferred embodiment, the term "crystalline grains" indicates a single crystal region surrounded by a boundary in which the crystal alignment is discontinuous, and this discontinuous boundary is defined as a crystal grain boundary. Accordingly, a discontinuous boundary formed by a dislocation or the like corresponds to a crystal grain boundary in the preferred embodiment. Meanwhile, the microscopic configuration and structure of the buffer layer are characteristic in the preferred embodiment, allowing high quality of the group III nitride semiconductor layer formed on the epitaxial substrate 10, as well as improvement of the characteristics of an FET including the HEMT device 20. Details of the structure of the buffer layer 2, and effects obtained when manufacturing an FET using the epitaxial substrate 10 having the buffer layer 2 will be later described.

The channel layer 3 is formed of a second group III nitride expressed in a composition formula $Al_{y2}Ga_{z2}N$ ($0 \leq y2 < 1$, $0 < z2 \leq 1$, $y2+z2=1$), having a thickness of approximately several μm. One of the preferable examples of the channel layer 3 is to be formed of GaN.

On the other hand, the barrier layer 4 is formed of a third group III nitride having a wider band gap than that of the second group III nitride and having a composition formula $In_{x3}Al_{y3}Ga_{z3}N$ ($0 \leq x3 < 1$, $0 < y3 \leq 1$, $0 \leq z3 < 1$, $x3+y3+z3=1$), with a thickness of not more than 30 nm.

As one of the preferable examples, each of the buffer layer 2, the channel layer 3, and the barrier layer 4 is epitaxially formed with an MOCVD method (Metalorganic Chemical Vapor Deposition). Specifically, an epitaxial growth is performed using a well-known MOCVD furnace configured to be capable of supplying metalorganic (MO) source gas of In, Al, and Ga (TMI, TMA, TMG), ammonia gas, hydrogen gas, and nitrogen gas to inside of a reactor. That is, the buffer layer 2 is formed by supplying a gas in accordance with the composition formula of the first nitride in a state where the base 1 is placed on a susceptor provided in the reactor and heated to a formation temperature of a buffer layer, previously determined based on the composition formula of the first nitride or the like. As a result, the epitaxial substrate 10 is obtained. Further, the channel layer 3 and the barrier layer 4 can be formed in succession to forming the buffer layer 2 by setting a formation temperature of each of the channel layer 3 and the barrier layer 4 in accordance with the composition formula or the like, and supplying gases based thereon. Alternatively, instead of performing such a process successively, the previously manufactured epitaxial substrate 10 may be prepared to form the channel layer 3 and the barrier layer 4.

Meanwhile, if it is a method capable of forming each layer so as to have preferable crystalline quality, other epitaxial growth methods, for example, various vapor-phase or liquid-phase growth methods such as MBE, HVPE, and LPE, may be appropriately selected to be used, or different epitaxial growth methods are combined to be used.

The gate electrode 5 is a multilayered metal electrode formed of Pt/Au, each layer having a thickness of approximately a dozen nm to a hundred and several tens nm. The gate electrode 5 is formed to have a schottky contact with the barrier layer 4. The gate electrode 5 is formed by a vacuum evaporation method and a photolithography process, as one of the preferable examples. However, the aforementioned configuration of the gate electrode 5 is only one of the preferred embodiments, and so the gate electrode 5 may be provided as a multilayer or single layer electrode formed of other metallic elements.

The source electrode 6 and the drain electrode 7 are multilayered metal electrodes formed of Ti/Al/Ni/Au, each layer having a thickness of approximately a dozen nm to a hundred and several tens nm. The source electrode 6 and the drain electrode 7 are formed to have an ohmic contact with the barrier layer 4. The source electrode 6 and the drain electrode 7 are formed by a vacuum evaporation method and a photolithography process, as one of the preferable examples. However, the aforementioned configuration of the source electrode 6 and the drain electrode 7 is only one of the preferred embodiments, and so the source electrode 6 and the drain electrode 7 may be provided as a multilayer or single layer electrode formed of other metallic elements. It should be noted that heat treatment of several tens of seconds (e.g. 30 seconds) is preferably performed in a nitrogen gas atmosphere with a predetermined temperature between 650° C. and 1000° C. (e.g. 850° C.) after forming the electrodes in order to improve the ohmic contact of both electrodes.

In the HEMT device 20 having such a configuration, an interface of the channel layer 3 and the barrier layer 4 is to be a heterojunction interface, so that a two-dimensional electron gas region 3e with electrons of high concentration is formed on the interface (more in detail, near the interface of the channel layer 3).

<Buffer Layer>

Figure 2A:
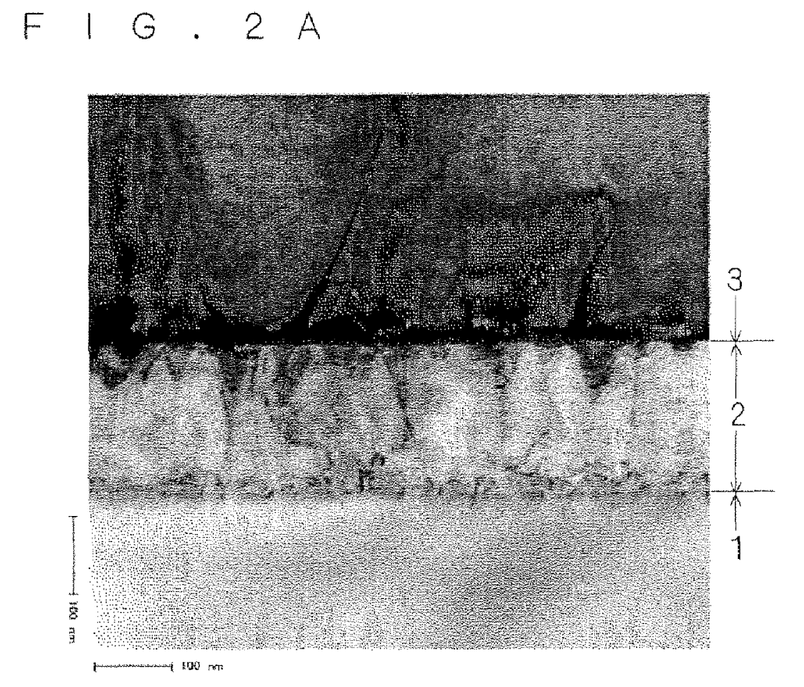
FIGS. 2A and 2B are views for showing a configuration of a buffer layer more in detail.
Figure 2B:
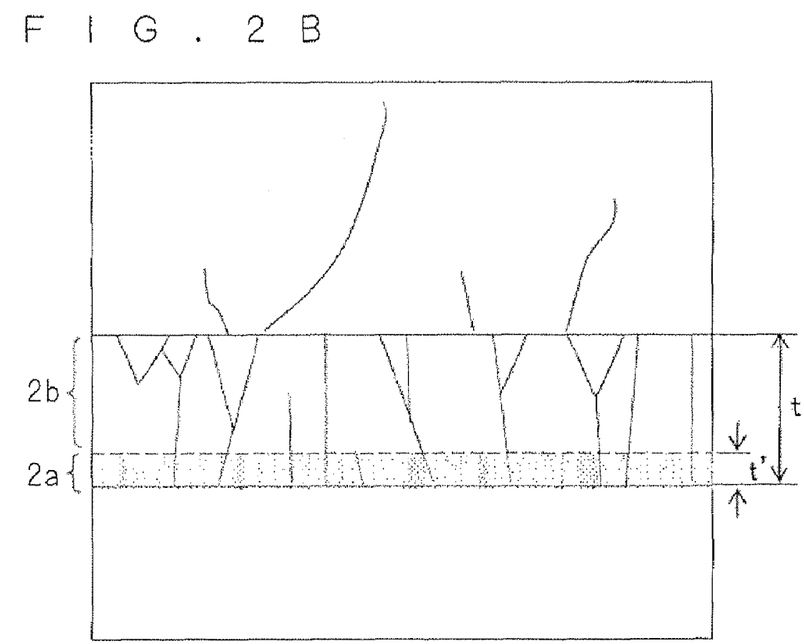
Figure 3A:
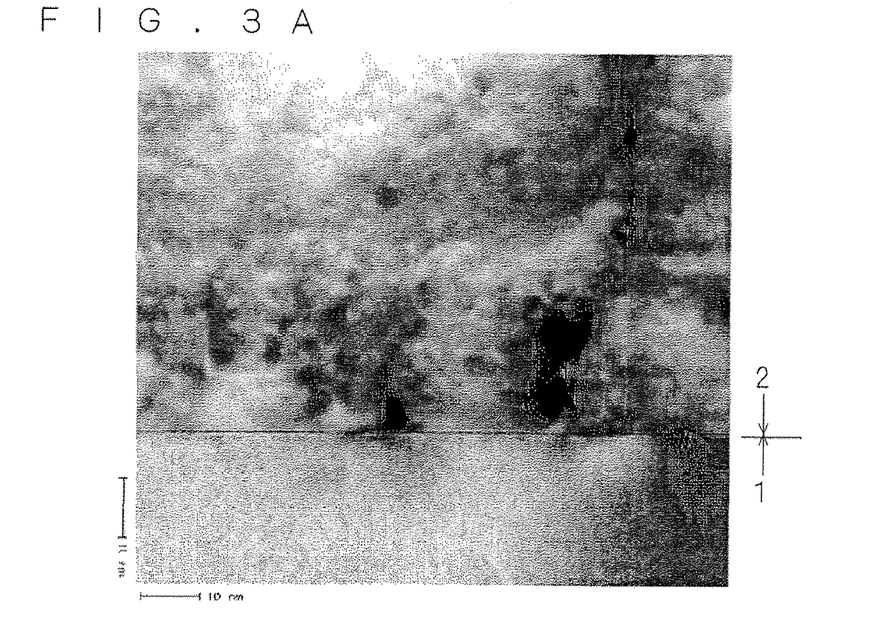
FIGS. 3A and 3B are views for showing a configuration of a buffer layer more in detail.
Figure 3B:
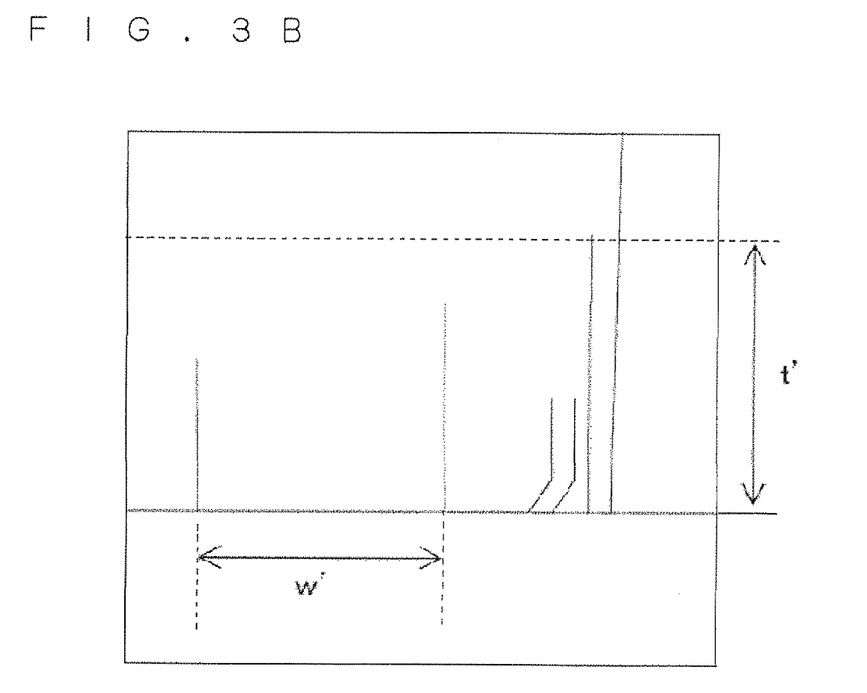

Next, the buffer layer 2 will be described more in detail. FIGS. 2A, 2B, 3A, and 3B are views for showing the configuration of the buffer layer 2 more in detail. FIGS. 2A and 3A are results of imaging of a cross-section of the HEMT device 20 by a TEM (Transmission electron microscopy) (TEM image). FIG. 2A is a TEM image of the proximity of the buffer layer 2, and FIG. 3A is an enlarged TEM image of the proximity of the interface between the base 1 and the buffer layer 2. FIGS. 2B and 3B are views for simply reproducing a state of crystal grain boundary (including a boundary of a single crystal domain region in the present specification) mainly confirmed in the corresponding TEM image. FIGS. 2A, 2B, 3A, and 3B are targeting the epitaxial substrate 10 where the buffer layer 2 is formed of AlN and the HEMT device 20 where the channel layer 3 of GaN and the barrier layer 4 of $Al_{0.20}Ga_{0.80}N$ are formed just on the epitaxial substrate 10.

While the buffer layer 2 is successively formed in one forming condition (without using another forming condition on the way), as illustrated in the TEM image of FIG. 2A, there is a remarkable difference in distribution of the crystal grain boundary (i.e. size of crystalline grain) between a part near the interface of the base 1 and a part above therefrom including at least a surface of the epitaxial substrate 10. The former part is referred to as a lower part 2a of the buffer layer, and the latter part is referred to as an upper part 2b of the buffer layer. While the crystal grain boundary exists densely with an interval of at most approximately several tens of nm (see FIGS. 3A and 3B), and the shape of the crystal is not necessarily clear in the lower part 2a, in the upper layer 2b, the crystal grain boundary from the base 1 reaching substantially vertically to the surface of the buffer layer 2 exists with an interval of at least approximately 100 nm, and relatively larger columnar crystal is formed than the crystal existing in the lower part 2a. In other words, the lower part 2a has many more grain boundaries than the upper part 2b.

FIGS. 1 and 2B illustrate to have a clear interface between the lower part 2a and upper part 2b for the sake of simplicity of the figures, but there is not necessarily a clear interface between them, and the transition of the shape of crystalline grain between them is local but gradational according to the TEM image of FIG. 2A. Thereby, while the buffer layer 2 can be regarded as having a two-layer structure of the lower part 2a and the upper part 2b whose formation of crystalline grain is different, more in detail, the buffer layer 2 is configured to have a transition structure in which the formation of crystalline grain transits locally and gradationally between them. Thus, the preferred embodiment is characteristic in that the buffer layer 2 having such a transition structure is successively formed in the same composition formula from the beginning to the end without differentiating the forming condition.

Figure 4:
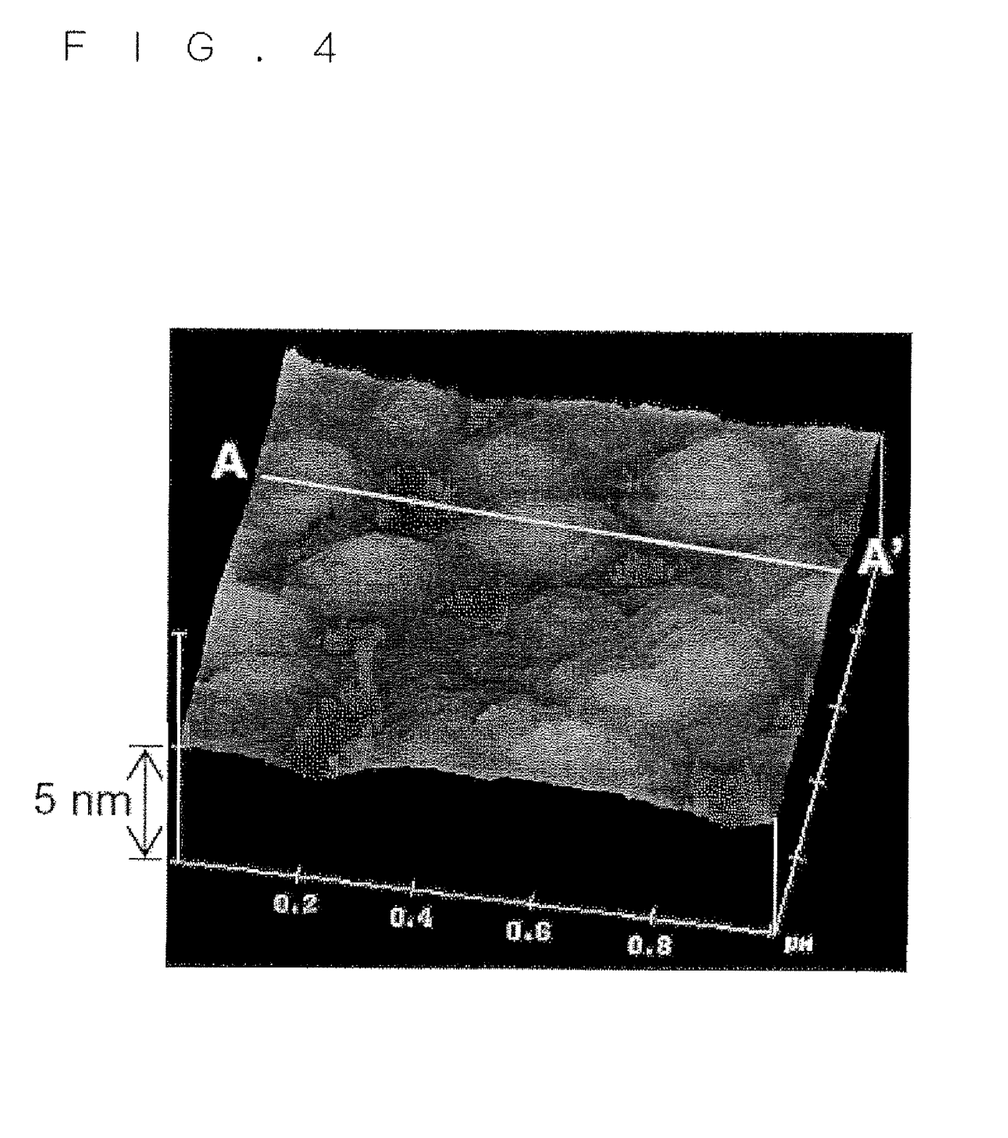
FIG. 4 is a view for showing an observation (AFM image) of a surface of an epitaxial substrate (surface of a buffer layer) by an AFM.
Figure 5:
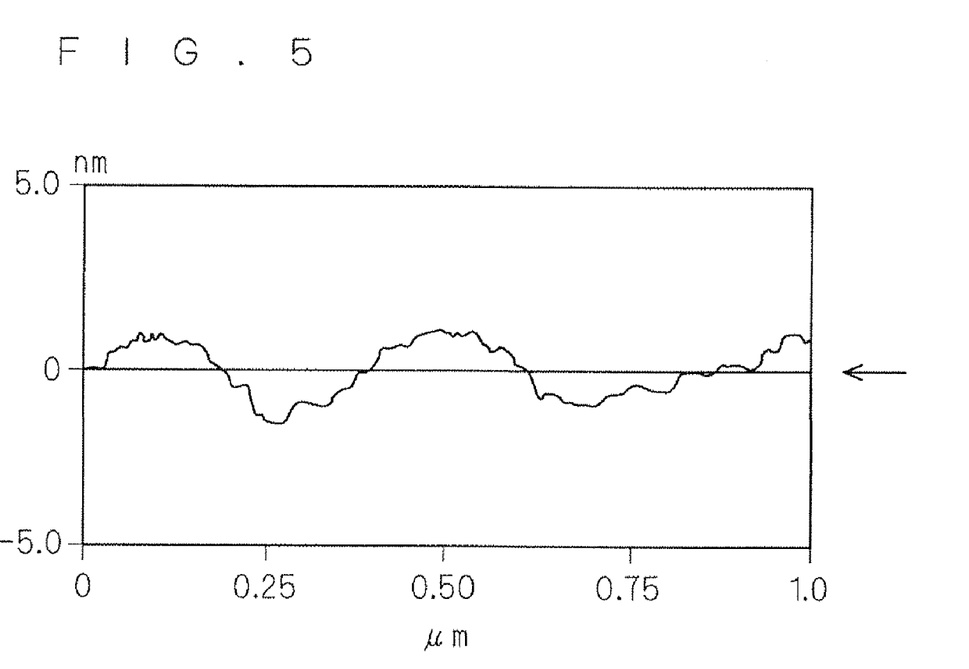
FIG. 5 is a cross sectional view A-A' of FIG. 4.

FIG. 4 is a view for showing a result of the observation of a surface of the epitaxial substrate 10 (a surface of the buffer layer 2) by an AFM (atomic force microscope) (AFM image). FIG. 5 is a cross sectional view at A-A' of FIG. 4. As illustrated in FIGS. 4 and 5, concavity and convexity are formed on the surface of the buffer layer 2. This is due to unevenness of the surface of the respective columnar crystals. The observation shows that at least the upper part 2b is formed of numerous columnar polycrystalline.

<Relationship Between Configuration of Buffer Layer and Device Characteristics>

Next, the relationship between the buffer layer 2 and the FET when the FET is manufactured by forming a functional layer or the like on the epitaxial substrate 10 will be described. More particularly, it will be described targeting the case where the HEMT device 20 is manufactured.

Figure 6:
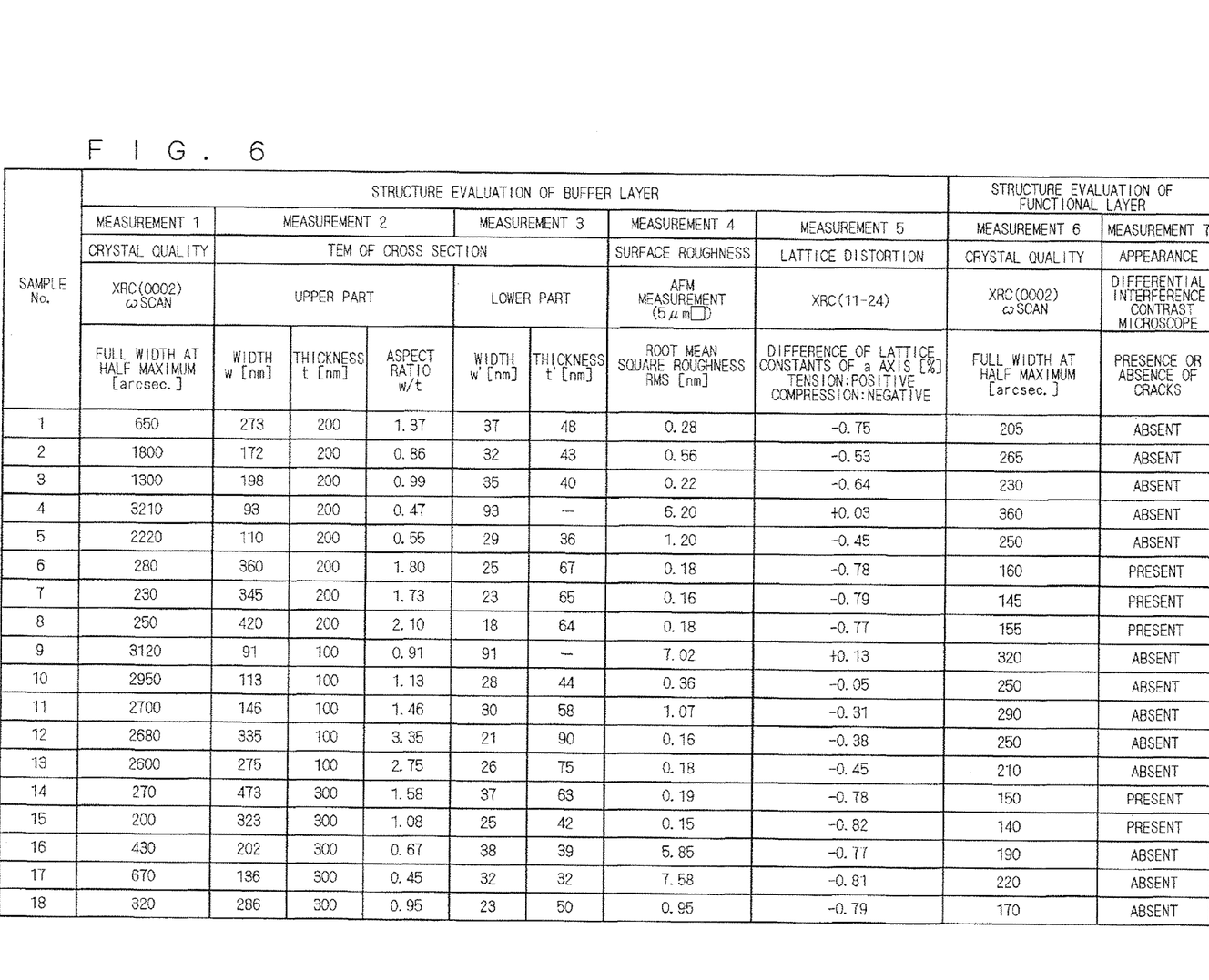
FIG. 6 is a view for showing a list of 7 evaluation results of 18 types of epitaxial substrates where a buffer layer is formed under the different conditions and laminated structures obtained by forming functional layers on each epitaxial substrate.

FIG. 6 is a view for showing a list of the result ("measurement 1" to "measurement 5") of the structural evaluation of each of the buffer layers 2 with respect to 18 types of epitaxial substrates 10 where an AlN layer as the buffer layer 2 is formed with different forming conditions, and the result ("measurement 6" and "measurement 7") of the structural evaluation of each of functional layers with respect to a laminated structure (also referred to as a semiconductor device substrate) obtained by forming functional layers (GaN layer as the channel layer 3, and an $Al_{0.20}Ga_{0.80}N$ layer as the barrier layer 4) on the 18 types of the epitaxial substrates 10 with the same forming condition (see the example for details of the forming condition of the buffer layer regarding each sample).

A full width at half maximum of a peak profile obtained by an X-ray rocking curve measurement (ω scan) of a (0002) plane of the buffer layer 2 is shown as "measurement 1".

In the result shown as "measurement 2", the values of a width w of the crystal grain boundary in the upper part 2b and an aspect ratio w/t are obtained on the basis of the TEM image as shown in FIG. 2A. On the other hand, a formation thickness t is a set value. Specifically, the number of the crystal grain boundary in a direction (a horizontal direction in FIG. 2A) substantially parallel to the surface of the base 1 of the upper part 2b is counted in a range of a view width of the TEM image, and a value obtained by dividing the resultant counted value by the view width is defined as a width w (nm) of the crystal grain boundary of the upper part 2b, and the ratio w/t of the width w of the crystal grain boundary to the formation thickness t (nm) of the buffer layer 2 is defined as an aspect ratio of columnar crystals forming the upper part 2b.

Similarly, the result shown as "measurement 3" is a value obtained on the basis of the TEM image as shown in FIG. 3A. Specifically, the number of the crystal grain boundary in a direction substantially parallel to the surface of the base 1 of the lower part 2a (a horizontal direction in FIG. 3A) is counted in a range of a view width of the TEM image, and a value obtained by dividing the resultant counted value by the view width is defined as a width w' (nm) of the crystal grain boundary of the lower part 2a, specifying an average interface position between the lower part 2a and the upper part 2b from the TEM image as shown in FIG. 2A to define a distance between the interface position and the surface of the base 1 as a thickness t' (nm) of the lower part 2a (see FIGS. 2B and 3B). Meanwhile, a transition structure is not confirmed in the buffer layer 2 with respect to samples Nos. 4 and 9, so that the thickness t' of the lower part 2a is not recited therein, and the same value as the width w of the crystal grain boundary of the upper part 2b is recited in the width w' of the crystal grain boundary of the lower part 2a.

The result shown as "measurement 4" is root mean square roughness (RMS) obtained on the basis of the result of measuring the area of 5 μm square of the surface of the buffer layer 2 by the AFM.

Lattice distortion shown as "measurement 5" is a value of a ratio of a lattice constant of an a axis of AlN calculated from the peak profile obtained by an X-ray diffraction measurement of a (11-24) plane of the buffer layer 2 to the lattice constant in an ideal state (bulk state). When the resultant value is positive, tensile stress is to be operating in an in-plane direction of the surface of the buffer layer 2. In constant, when the resultant value is negative, compression stress is to be operating in the in-plane direction of the surface of the buffer layer 2.

A full width at half maximum of a peak profile obtained by the X-ray rocking curve measurement (ω) scan) of a (0002) plane of the functional layer is shown as "measurement 6".

The result shown as "measurement 7" shows presence or absence of cracks confirmed by observing the surface of the functional layer with a differential interference contrast microscope.

As shown in "measurement 1" and "measurement 6" in FIG. 6, in the case the full width at half maximum of the X-ray rocking curve by ω scan of the (0002) plane of the buffer layer 2 is not less than 300 seconds and not more than 3000 seconds, the functional layer having excellent crystal quality without causing cracks where the full width at half maximum of the X-ray rocking curve by ω scan of the (0002) plane is not more than 300 seconds is formed (Nos. 1 to 3, 5, 10 to 13, 16 to 18). All the samples satisfying the above requirement include the buffer layer 2 having the aforementioned transition structure.

These results indicate that, when using the epitaxial substrate 10 including the buffer layer 2 which has the transition structure, and is formed in a manner that the upper part 2b is to be columnar polycrystalline and that the full width at half maximum of the X-ray rocking curve by ω scan of the (0002) plane is not less than 300 seconds and not more than 3000 seconds, the functional layers having excellent crystal quality can be formed thereon.

Figure 7:
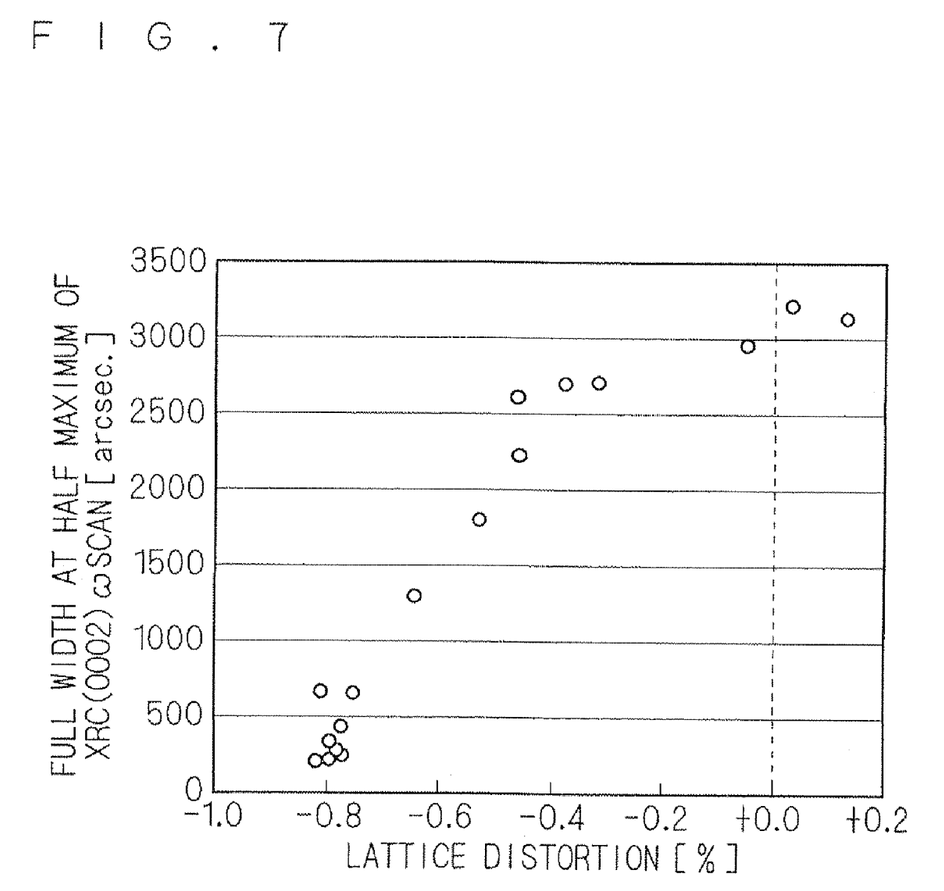
FIG. 7 is a view for showing the relationship between a full width at half maximum obtained in "measurement 1" and lattice distortion obtained in "measurement 5".

Meanwhile, the result of "measurement 5" shows that the compression stress is inherent in the in-plain direction of the surface of the buffer layer 2, with respect to the samples with the buffer layer 2 having the transition structure among 18 types of samples prepared this time. Further, FIG. 7 is a view for showing the relationship between the full width at half maximum obtained in "measurement 1" and the lattice distortion obtained in "measurement 5". The result shown in FIG. 7 illustrates that when the value of the lattice distortion is negative (when the compression stress is inherent in the surface of the buffer layer 2), the full width at half maximum of the rocking curve of the buffer layer 2 is not more than 3000 seconds.

Figure 8A:
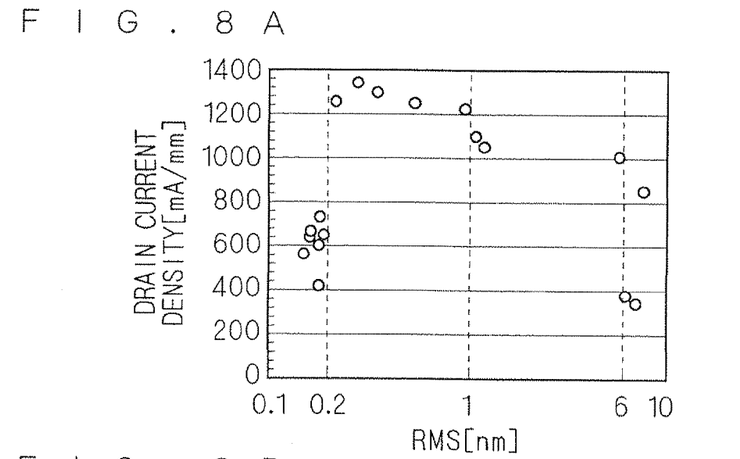
FIGS. 8A to 8C are views for showing the relationship between electronic characteristics and root mean square roughness (RMS) of concavity and convexity of the buffer layer with respect to an HEMT device.
Figure 8B:
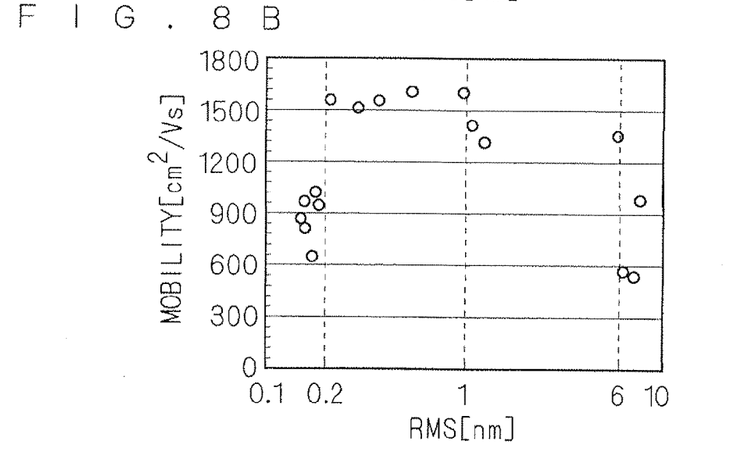
Figure 8C:
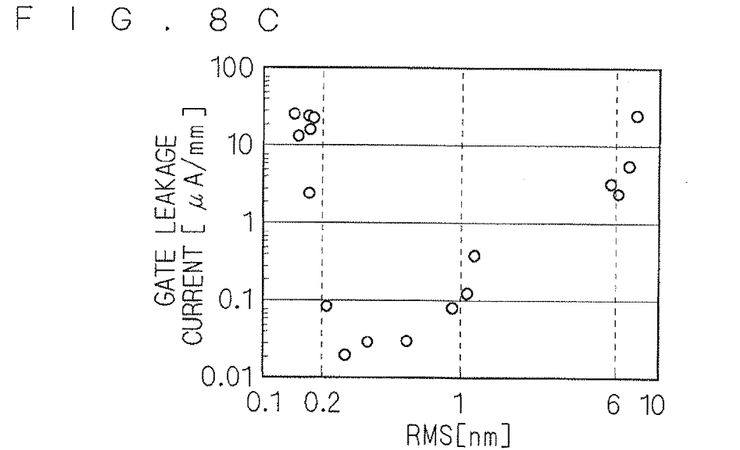

FIGS. 8A to 8C are views for showing the relationship between electronic characteristics and root mean square roughness (RMS) of concavity and convexity of the buffer layer 2 with respect to the HEMT device 20 manufactured by forming a gate electrode, a source electrode, and a drain electrode on the laminated structure shown in FIG. 6. FIG. 8A shows the relationship with the drain current density. FIG. 8B shows the relationship with the electron mobility. FIG. 8C shows the relationship with the gate leakage current.

As shown in FIGS. 8A to 8C, when the value of the RMS is within the range of not less than 0.2 nm and not more than 6 nm, excellent characteristics of the HEMT device where the drain current density is not less than 1000 mA/mm, and the mobility is not less than 1300 $cm^2$/Vs (these characteristics are to be referred to as a first characteristics level), can be provided.

On the other hand, as shown in the results of "measurement 1" and "measurement 4", all the samples with the RMS within the range of not less than 0.2 nm and not more than 6 nm include the buffer layer 2 having the transition structure, and the full width at half maximum of the X-ray rocking curve by ω scan of the (0002) plane of the buffer layer 2 is within the range of not less than 300 seconds and not more than 3000 seconds.

The above things indicate that the FET with the first characteristics level can be achieved without causing cracks, by using the epitaxial substrate 10 in which the buffer layer 2 is formed to have the transition structure, at least the upper part 2b to be columnar polycrystalline, and the full width at half maximum of the X-ray rocking curve by ω scan of the (0002) plane to be not less than 300 seconds and not more than 3000 seconds, with the value of RMS being within the range of not less than 0.2 nm and not more than 6 nm (Nos. 1 to 3, 5, 10, 11, 16, 18).

Furthermore, according to the result of "measurement 2", in the buffer layer 2 of the epitaxial substrate 10 capable of fabricating the FET with the first characteristics level, the aspect ratio (w/t) of the upper part 2b is within the range of not less than 0.5 and not more than 1.5. Thus, it is also said that the FET with the first characteristics level can be achieved, by using the epitaxial substrate 10 in which the buffer layer 2 is formed to have the transition structure, at least the upper part 2b to be columnar polycrystalline, and the full width at half maximum of the X-ray rocking curve by ω scan of the (0002) plane to be not less than 300 seconds and not more than 3000 seconds, with the aspect ratio (w/t) of the upper part 2b being within the range of not less than 0.5 and not more than 1.5.

Figure 9:
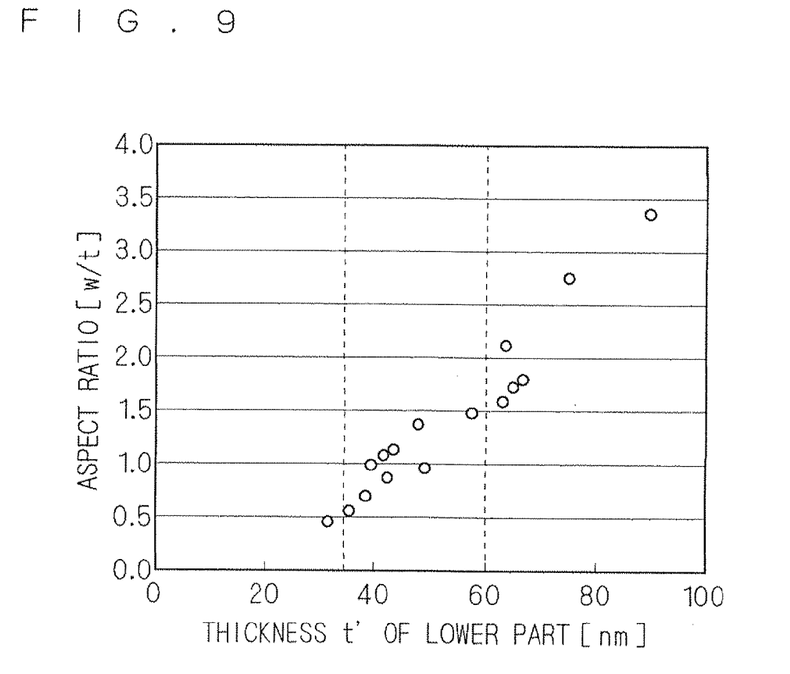
FIG. 9 is a view for showing the relationship between a formation thickness of a lower part of the buffer layer and an aspect ratio w/t.

FIG. 9 is a view for showing the relationship between a formation thickness t' of the lower part 2a and the aspect ratio w/t. Referring to FIG. 9, the formation thickness t' of the lower part 2a is within the range of not less than 35 nm and not more than 60 nm in the epitaxial substrate 10 satisfying the aspect ratio of not less than 0.5 and not more than 1.5. Further, according to the result shown in "measurement 2", the width w of the crystal grain boundary of the upper part 2b is within the range of not less than 100 nm and not more than 300 nm in the epitaxial substrate 10 satisfying the above aspect ratio. From the above, it is necessary for the epitaxial substrate 10 capable of fabricating the FET with the first characteristics level that the buffer layer 2 is formed in a manner that the formation thickness t' of the lower part 2a and the width w of the crystal grain boundary of the upper part 2b are within the above range, respectively.

Further, referring to FIGS. 8A to 8C, when the value of RMS is within the range between 0.2 and 1 nm, more excellent characteristics of the HEMT device 20 than the first characteristics level (this is to be referred to as a second characteristics level) where the mobility of carriers is not less than 1500 $cm^2$/Vs, the drain current density is not less than 1200 mA/mm, and the gate leakage current is not more than 0.1 µA/mm, can be provided (Nos. 1 to 3, 10, 18).

Accordingly, the FET with the second characteristics level can be achieved by using the epitaxial substrate 10 in which the buffer layer 2 is formed to have the transition structure, at least the upper part 2b to be columnar polycrystalline, and the full width at half maximum of the X-ray rocking curve by ω scan of the (0002) plane to be not less than 300 seconds and not more than 3000 seconds, with RMS being within the range between 0.2 and 1 nm.

Furthermore, according to the result of "measurement 2", in the buffer layer 2 of the epitaxial substrate 10 capable of fabricating the FET with the second characteristics level, the aspect ratio (w/t) of the upper part 2b is within the range of not less than 0.8 and not more than 1.4. Thus, the buffer layer 2 has a configuration to be regarded as a two-layer configuration, and is formed in a manner that at least the upper part 2b is to be columnar polycrystalline, the full width at half maximum of the X-ray rocking curve by ω scan of the (0002) plane to be not less than 300 seconds and not more than 3000 seconds, and the aspect ratio (w/t) of the upper part 2b is within the range of not less than 0.8 and not more than 1.4.

Thus, it is also said that the FET with the second characteristics level can be achieved by using the epitaxial substrate 10 in which the buffer layer 2 is formed to have the transition structure, at least the upper part 2b to be columnar polycrystalline, and the full width at half maximum of the X-ray rocking curve by ω scan of the (0002) plane to be not less than 300 seconds and not more than 3000 seconds, with the aspect ratio (w/t) of the upper part 2b being within the range of not less than 0.8 and not more than 1.4.

As shown by the result of "measurement 3", with respect to the samples satisfying the aspect ratio of not less than 0.8 and not more than 1.4, the width w of the crystal grain boundary of the upper part 2b is within the range of not less than 100 nm and not more than 300 nm, and the formation thickness t' of the lower part 2a is within the range of not less than 40 nm and not more than 50 nm. From the above, it is necessary for the epitaxial substrate 10 capable of fabricating the FET with the second characteristics level that the buffer layer 2 is formed in a manner that the formation thickness t' of the lower part 2a and the width w of the crystal grain boundary of the upper part 2b are within the above range, respectively.

Figure 10:
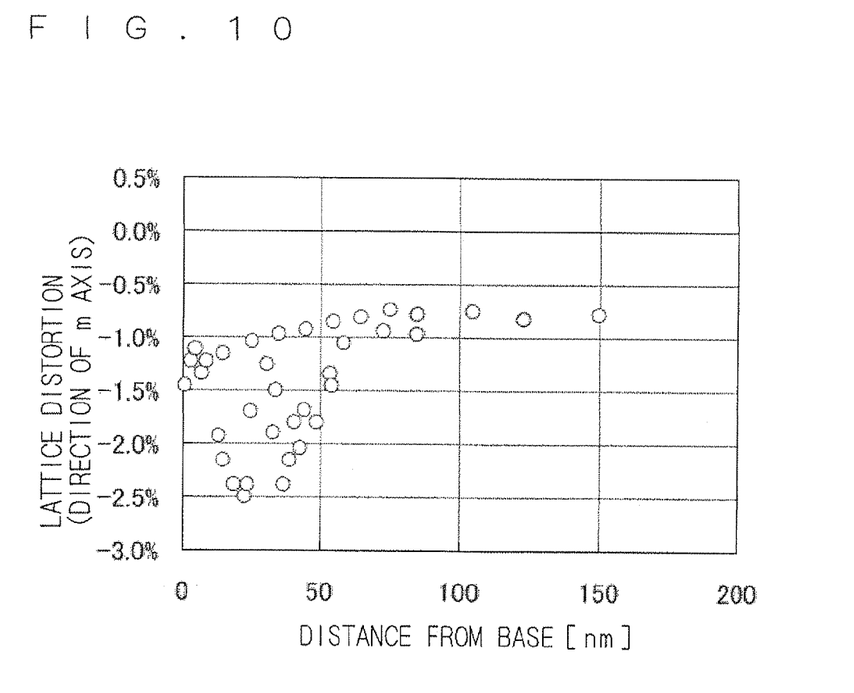
FIG. 10 is a view of plotting lattice distortion of crystalline grain forming the buffer layer in a direction of an m axis, to a distance from a surface of a base of each crystalline grain with respect to No. 1 sample.
Figure 11:
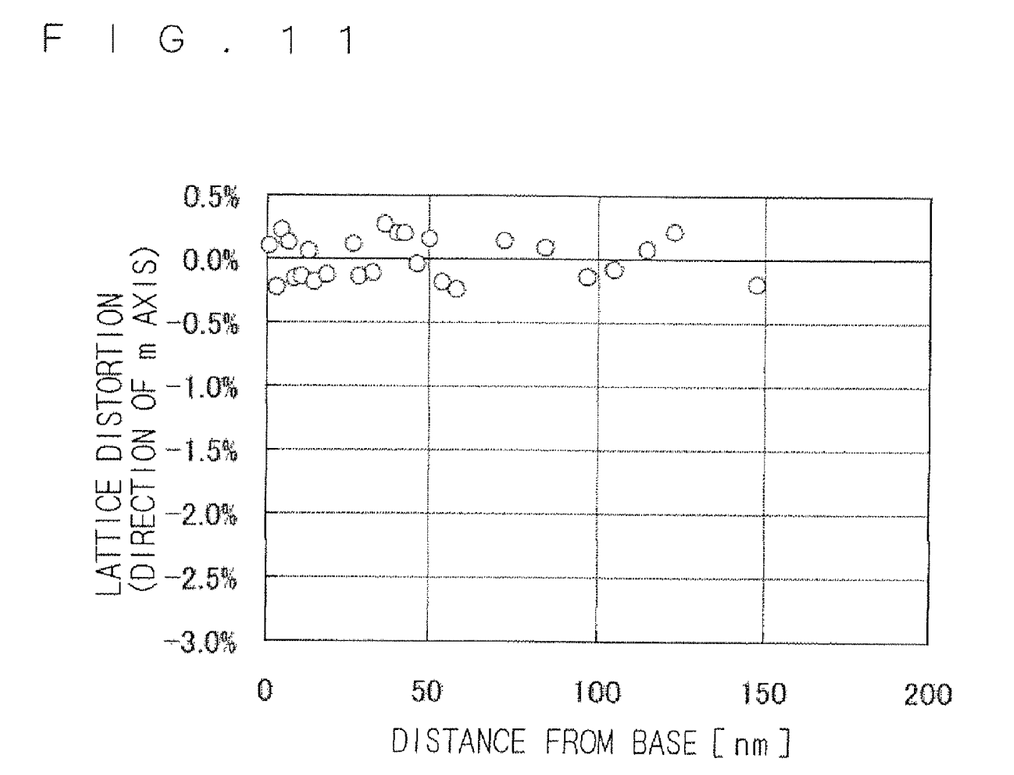
FIG. 11 is a view of plotting lattice distortion of crystalline grain forming the buffer layer in a direction of an m axis to a distance from a surface of a base of each crystalline grain with respect to No. 5 sample.

FIG. 10 is a view of plotting lattice distortion of crystalline grain forming the buffer layer 2 in a direction of an m axis, calculated by measuring a lattice length in the TEM image, to a distance from the surface of the base 1 of each crystalline grain, with respect to No. 1 sample achieving the FET with the second characteristics level. FIG. 11 is a view of plotting the same as the above, with respect to No. 5 sample achieving the FET with the first characteristics level. In both of the figures, the values are made as positive when the tensile stress is operating.

In FIG. 11, the values of the lattice distortion are in the range from −0.5% to +0.5%, and are confirmed to be nearly constant regardless of a distance from the surface of the base 1, which is almost 0%. In contrast, in FIG. 10, the values of the lattice distortion of the crystal grains existing in the range of approximately 30 to 50 nm from the surface of the base 1 are distributed in the range from −2.5% to −0.5%, and are confirmed to be nearly constant in the range from −1.0% to −0.5% in the distance far from the above range from the base 1. These results illustrate that it is necessary for the compression distortion in the in-plane direction to be inherent in the crystal grains existing near the interface between at least lower part 2a and the base 1 in achieving the FET with the second characteristics level. More specifically, it is necessary to distribute the compression distortion of each crystal grain with the absolute value in the range of not less than 0.5% and not more than 2.5% in the distance at least up to 30 nm from the interface, and with respect to the crystal grains existing far from the above distance from the interface, in the region with the distance of at least approximately 65 nm far from the interface, or at least in the region with the distance of 100 nm, it is necessary to include the compression distortion which is substantially constant to the extent of the absolute value approximately from 0.5% to 1.0%.

As described above, according to the preferred embodiment, the epitaxial substrate capable of forming preferable functional layers without causing cracks can be achieved by forming the buffer layer on the base so as to have the transition structure, and the full width at half maximum of the X-ray rocking curve by ω scan of the (0002) plane to be not less than 300 seconds and not more than 3000 seconds. Further, the epitaxial substrate is formed in a manner that the root mean square roughness of the surface of the buffer layer is within the range of not less than 2 nm and not more than 6 nm, and by fabricating the FET therewith, it is possible to achieve the FET with the excellent device characteristics having the drain current density of at least 1000 mA/mm, and the mobility of at least 1300 cm²/Vs.

[Example]

A plurality of semi-insulating single crystal 6H—SiC bases were prepared as the base 1, and an AlN layer was formed as the buffer layer 2 by an MOCVD method, to fabricate 18 types of a plurality of epitaxial substrates 10, each type corresponding to No. 1 to No. 18 in FIG. 6. Specifically, each of the 6H—SiC bases was set in a susceptor inside a reactor of a well-known MOCVD furnace, and was heated by the susceptor while the AlN layer was formed by introducing TMA (trimethyl aluminum) as an Al source gas into the reactor by bubbling of hydrogen gas, with ammonia gas flowing, and hydrogen gas being used as a carrier gas. The flow volume of ammonia gas was 3000 sccm. Eighteen types of samples were obtained by variously setting the temperature of the susceptor within the range between 1050° C. and 1250° C., the pressure inside the reactor within the range between 50 Torr and 200 Torr, and setting the thickness of the AlN layer to be one of 100 nm, 200 nm, and 300 nm.

Furthermore, following to the formation of the AlN layers, a GaN layer as the channel layer 3 and an AlGaN layer as the barrier layer 4 were sequentially formed, excluding some AlN layers. The GaN layer was formed by introducing TMG (trimethyl gallium) as a Ga source gas into the reactor by bubbling of hydrogen gas, setting the temperature of the susceptor at 1100° C., the pressure inside the reactor at 150 Torr, with hydrogen gas and nitrogen gas being used as carrier gases, and ammonia gas flowing with the flow volume of 1000 sccm. The thickness of the GaN layer was 2 μm. On the other hand, the AlGaN layer was formed by introducing TMG and TMA into the reactor by bubbling of hydrogen gas, setting the temperature of the susceptor at 1100° C., the pressure inside the reactor at 40 Torr, with hydrogen gas used as a carrier gas, with ammonia gas flowing with the flow volume of 500 sccm. The thickness of the AlGaN layer was 25 nm. After forming the AlGaN layer, the temperature of the resultant epitaxial substrate was lowered to a room temperature, with hydrogen gas and ammonia gas flowing.

Some epitaxial substrates were ejected from the MOCVD furnace without forming these functional layers thereon, and "measurement 1" to "measurement 5" were performed. Also, the aforementioned "measurement 6" and "measurement 7" were performed on the resultant laminated structure. The results shown in FIG. 6 were obtained from each measurement.

Furthermore, the HEMT device 20 was manufactured by forming the gate electrode 5, source electrode 6, and drain electrode 7 on the resultant laminated structure. The gate width was set to be 1 mm, the gate length to be 1.5 μm, the interval between the source and gate to be 0.5 μm, and the interval between the gate and drain to be 7.5 μm. Each of the drain current density, electron mobility, and gate leakage current of the resultant HEMT device was measured, and the results shown in FIG. 8A to 8C were obtained.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate, comprising:
   a base constituted of α-SiC single crystal;
   a buffer layer formed by epitaxially growing on said base, and formed of a group III nitride expressed in a composition formula $In_{x1}Al_{y1}Ga_{z1}N$ ($0 \leq x1 \leq 1$, $0 < y1 \leq 1$, $0 \leq z1 \leq 1$, $x1+y1+z1=1$), wherein
   an upper part of said buffer layer including a surface part of said epitaxial substrate is formed of columnar polycrystalline including a grain boundary existing on said base in a direction substantially perpendicular to the substrate surface and being oriented at a c axis, a lower part of said buffer layer which is near an interface with said base has more grain boundaries than said upper part of said buffer layer, transition of shape of crystalline grain between said lower part and said upper part of said buffer layer is local and gradational, and a full width at half maximum of an X-ray rocking curve (0002) ω scan of said upper part of said buffer layer is not less than 300 seconds and not more than 3000 seconds.

2. The epitaxial substrate according to claim 1, wherein root mean square roughness of a surface of said buffer layer is not less than 0.2 nm and not more than 6 nm.

3. The epitaxial substrate according to claim 1, wherein a ratio of a grain boundary width of crystalline grain existing in said upper part of said buffer layer in a direction parallel to a surface of said base, and a formation thickness of said buffer layer is not less than 0.5 and not more than 1.5.

4. The epitaxial substrate according to claim 2, wherein said grain boundary width of the crystalline grain is not less than 100 nm and not more than 300 nm.

5. The epitaxial substrate according to claim 2, wherein an average formation thickness of said lower part of said buffer layer is not less than 35 nm and not more than 60 nm.

6. The epitaxial substrate according to claim 1, wherein lattice distortion is inherent in said buffer layer in a direction of in-plane compression.

7. The epitaxial substrate according to claim 6, wherein said buffer layer has distribution of lattice distortion with an absolute value of not less than 0.5% and not more than 2.5% in the direction of in-plane compression within a range of 30 nm from the interface with said base.

8. The epitaxial substrate according to claim 7, wherein said buffer layer has substantially constant lattice distortion with an absolute value of not less than 0.5% and not more than 1.0% in the direction of in-plane compression in a range of at least 100 nm far from the interface with said base.

9. The epitaxial substrate according to claim 1, wherein said group III nitride is AlN.

10. The epitaxial substrate according to claim 1, wherein root mean square roughness of the surface of said buffer layer is not less than 0.2 nm and not more than 1 nm.

11. The epitaxial substrate according to claim 10, wherein the ratio of the grain boundary width of crystalline grain existing in said upper part of said buffer layer in the direction parallel to the surface of said base, to the formation thickness of said buffer layer is not less than 0.8 and not more than 1.4.

12. The epitaxial substrate according to claim 10, wherein the average formation thickness of said lower part of said buffer layer is not less than 40 nm and not more than 50 nm.

13. The epitaxial substrate according to claim 10, wherein lattice distortion of not less than 1% in a direction of in-plane tension is inherent in crystalline grain of said lower part of said buffer layer, existing in a range of not more than 15 nm from said base.

14. A semiconductor device substrate, comprising:
a base constituted of α-SiC single crystal;
a buffer layer formed by epitaxially growing on said base, and formed of a group III nitride expressed in a composition formula $In_{x1}Al_{y1}Ga_{z1}N$ ($0 \leq x1 \leq 1$, $0 < y1 \leq 1$, $0 \leq z1 \leq 1$, $x1+y1+z1=1$); and one functional layer or a plurality of functional layers formed on said buffer layer, and formed of a group III nitride being describable as $In_xAl_yGa_zN$, where x, y, z are determined in accordance with said one functional layer or each of said plurality of functional layers, satisfying $0 \leq x < 1$, $0 \leq y \leq 1$, $0 \leq z \leq 1$, $x+y+z=1$, wherein an upper part of said buffer layer including a surface for forming of said one functional layer or said plurality of functional layers is formed of columnar polycrystalline including a grain boundary existing on said base in a direction substantially perpendicular to a substrate surface and being oriented at a c axis, a lower part of said buffer layer which is near an interface with said base has more grain boundaries than said upper part of said buffer layer, transition of shape of crystalline grain between said lower part and said upper part of said buffer layer is local and gradational, a full width at half maximum of an X-ray rocking curve (0002) ω scan of said upper part of said buffer layer is not less than 300 seconds and not more than 3000 seconds, and root mean square roughness of a surface of said buffer layer is not less than 0.2 nm and not more than 6 nm.

15. The semiconductor device substrate according to claim 14, wherein
said one functional layer or said plurality of functional layers is/are formed in a transistor structure.

16. The semiconductor device substrate according to claim 15, wherein
said one functional layer or said plurality of functional layers are a plurality of functional layers, said plurality of functional layers constituting an HEMT structure, where said plurality of functional layers include:
a channel layer formed of GaN, and
a barrier layer formed of $In_{x3}Al_{y3}Ga_{z3}N$ ($0 \leq x3 \leq 1$, $0 < y3 \leq 1$, $0 \leq z3 \leq 1$, $x3+y3+z3=1$).

17. An HEMT device, comprising:
a base constituted of α-SiC single crystal;
a buffer layer formed by epitaxially growing on said base, and formed of a first group III nitride expressed in a composition formula $In_xAl_yGa_zN$ ($0 \leq x \leq 1$, $0 < y \leq 1$, $0 \leq z \leq 1$, $x+y+z=1$);
a channel layer formed on said buffer layer and formed of GaN, and
a barrier layer formed on said channel layer and formed of $In_{x3}Al_{y3}Ga_{z3}N$ ($0 \leq x3 \leq 1$, $0 < y3 \leq 1$, $0 \leq z3 \leq 1$, $x3+y3+z3=1$), wherein
an upper part of said buffer layer including a surface for forming of said channel layer is formed of columnar polycrystalline including a grain boundary existing on said base in a direction substantially perpendicular to a substrate surface and being oriented at a c axis,
a lower part of said buffer layer which is near an interface with said base has more grain boundaries than said upper part of said buffer layer,
transition of shape of crystalline grain between said lower part and said upper part of said buffer layer is local and gradational,
a full width at half maximum of an X-ray rocking curve (0002) ω scan of said upper part of said buffer layer is not less than 300 seconds and not more than 3000 seconds, and
root mean square roughness of a surface of said buffer layer is not less than 0.2 nm and not more than 6 nm.

* * * * *